(12) United States Patent
Yoshio et al.

(10) Patent No.: US 6,333,591 B1
(45) Date of Patent: Dec. 25, 2001

(54) PIEZOELECTRIC RESONATOR

(75) Inventors: Masakazu Yoshio; Kenichi Kotani, both of Toyama-ken (JP)

(73) Assignee: Murata Manufacturing Co. Ltd., Kyoto (JP)

( * ) Notice: Subject to any disclaimer, the term of this patent is extended or adjusted under 35 U.S.C. 154(b) by 0 days.

(21) Appl. No.: 09/706,657

(22) Filed: Nov. 6, 2000

(30) Foreign Application Priority Data

Nov. 12, 1999 (JP) .................................................. 11-323009

(51) Int. Cl.⁷ .................................................... H01L 41/04
(52) U.S. Cl. ............................................. 310/367; 310/365
(58) Field of Search .................................... 310/321, 320, 310/313 R, 365, 366

(56) References Cited

FOREIGN PATENT DOCUMENTS 6-112756    4/1994 (JP) .

*Primary Examiner*—Nestor Ramirez
*Assistant Examiner*—Pedro J. Cuevas
(74) *Attorney, Agent, or Firm*—Keating & Bennett, LLP

(57) ABSTRACT

A piezoelectric resonator has a structure that enables easy manufacturing thereof and that damps the fundamental wave of a thickness vertical vibration mode with high accuracy, while effectively utilizing the resonance characteristics based on the third harmonic. In the piezoelectric resonator, first and second excitation electrodes are located on two main surfaces of a piezoelectric substrate, lead-out electrodes and terminal electrodes are provided for each of the first and second excitation electrodes, and each of the terminal electrodes is arranged to occupy an area that is not less than about 10% of the area of an annular region which ranges over a normal-line distance of about 1.2 d to about 2 d from the outer peripheral edge of each of the excitation electrodes, where d is the diameter of each of the excitation electrodes.

20 Claims, 7 Drawing Sheets

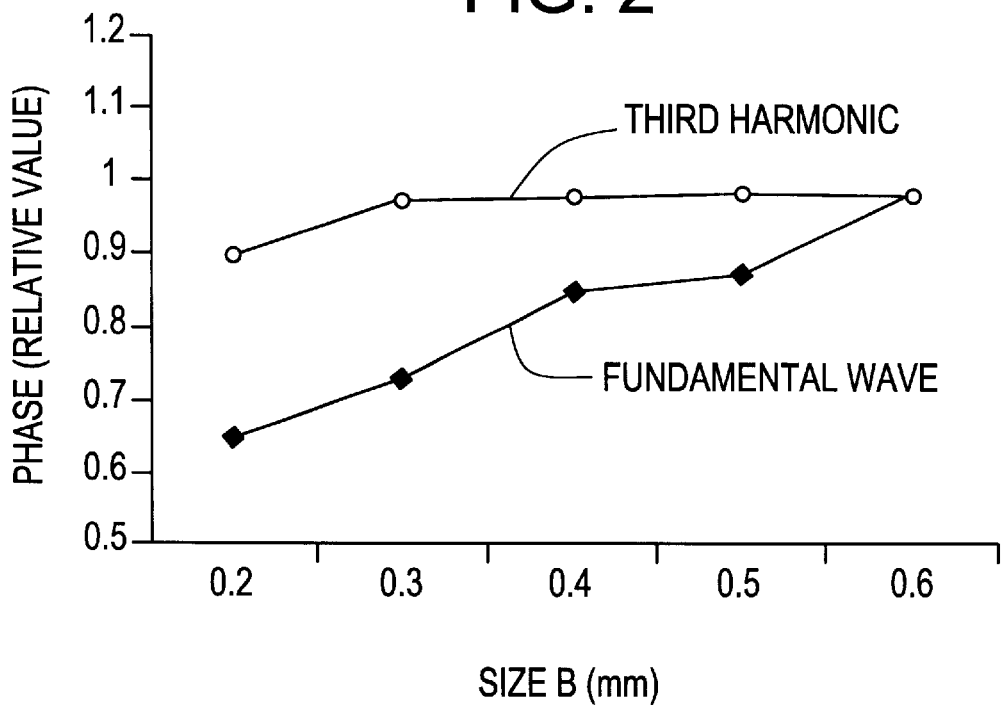
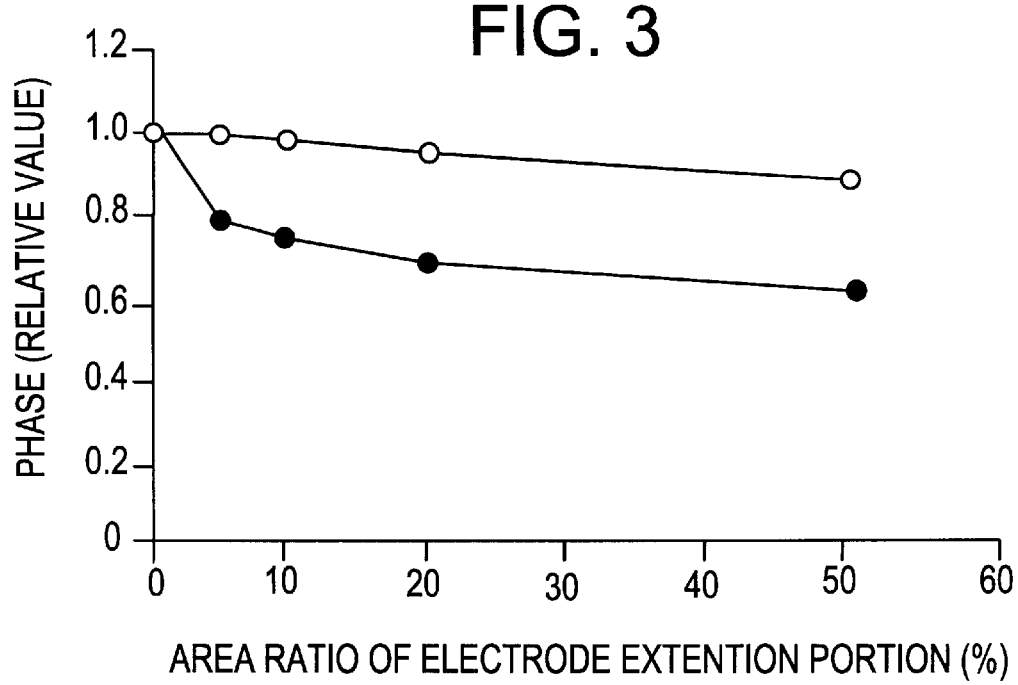

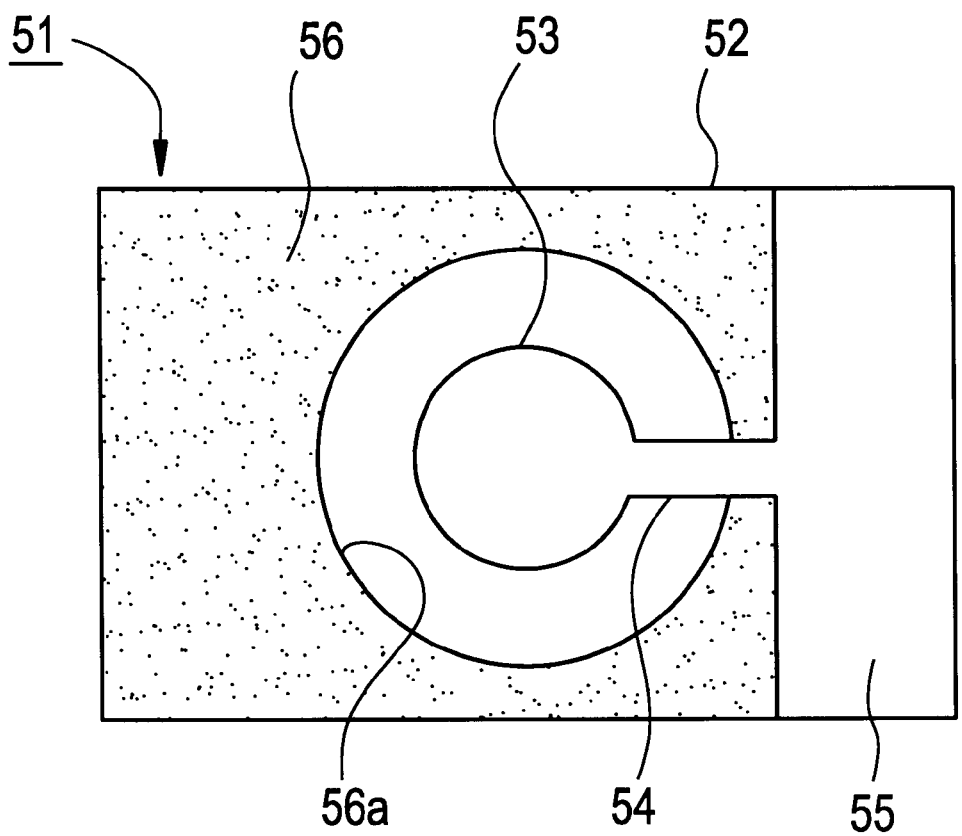

PIEZOELECTRIC RESONATOR

BACKGROUND OF THE INVENTION

1. Field of the Invention

The present invention relates to a piezoelectric resonator using the third harmonic of a thickness vertical vibration mode, and more particularly, the present invention relates to a piezoelectric resonator that effectively utilizes the resonance characteristics generated by the third harmonic while preventing the generation of a fundamental wave that produces spurious responses.

2. Description of the Related Art

Conventionally, an energy-trap type piezoelectric resonator has been widely used in piezoelectric oscillators and other devices. Japanese Unexamined Patent Application Publication No. 6-112756 discloses a piezoelectric resonator using the third harmonic of a thickness vertical vibration as a resonator which can be used in a higher frequency range.

As illustrated in FIG. 10, in a conventional piezoelectric resonator 51, an excitation electrode 53 is located at the central portion of the upper surface of a piezoelectric substrate 52 made of a piezoelectric ceramic. At the central portion of the lower surface of the piezoelectric substrate 52, another excitation electrode (not shown) is arranged so as to be opposed to the excitation electrode 53 with the piezoelectric substrate 52 disposed therebetween. These excitation electrodes disposed on both main surfaces define an energy-trap type piezoelectric resonance section utilizing a third harmonic of a vertical vibration mode.

On the upper surface of the piezoelectric substrate 52, a lead-out electrode 54 is connected to the excitation electrode 53, and a terminal electrode 55 is connected to the outside end of the lead-out electrode 54. Likewise, on the lower surface of the piezoelectric substrate 52, a lead-out electrode and terminal electrode are connected to the excitation electrode. The terminal electrode located on the lower surface is, however, disposed at the opposite end from the terminal electrode 55 located on the upper surface on the piezoelectric substrate 52.

Also, the piezoelectric resonator 51 is coated with a damping material 56 consisting of resin. The damping material 56 is disposed outside of the area between the excitation regions of the fundamental wave and the third harmonic of the thickness vertical vibration when the piezoelectric resonator 51 is driven. That is, in the piezoelectric resonator 51 utilizing a thickness vertical vibration mode, the excitation region of the fundamental wave is located outside that of the third harmonic. Therefore, applying the damping material 56 to the area outside of the area between the two excitation regions permits utilization of the third harmonic by damping only the fundamental wave and weakly damping the third harmonic.

In this case, the diameter of a circular opening 56a where the damping layer is not applied is six to twelve times as long as the wavelength of the third harmonic used.

In the piezoelectric resonator 51, however, the accuracy of applying and arranging the damping material 56 is not sufficient, and therefore, the piezoelectric resonator 51 cannot sufficiently damp the fundamental wave.

Also, since the damping material 56 is arranged to surround the excitation electrode 53, the piezoelectric resonator 51 must have a much larger size than the diameter of the opening 56a of the damping material 56. This makes it difficult to reduce the size of the piezoelectric resonator 51.

In addition, since the damping material 56 is arranged to surround the excitation electrode 53, there is a risk of a crack being generated in the piezoelectric substrate 52 when a thermal shock, an external force, or other stress is applied to the piezoelectric substrate 52.

SUMMARY OF THE INVENTION

To overcome the problems described above, preferred embodiments of the present invention provide a much smaller energy-trap type piezoelectric resonator that maximizes damping of a fundamental wave of a thickness vertical vibration mode with ease and accuracy, while effectively utilizing the resonance characteristics generated by the third harmonic of the thickness vertical vibration mode.

The piezoelectric resonator according to a preferred embodiment of the present invention includes a piezoelectric substrate, first and second excitation electrodes located on portions of first and second main surfaces of the piezoelectric substrate, respectively, and opposed to each other via the first and second excitation electrodes on the top and bottom surfaces, first and second lead-out electrodes electrically connected to the first and second excitation electrodes, respectively, and located on the first and second main surfaces of the piezoelectric substrate, respectively, and first and second terminal electrodes arranged to establish external connections, located at the end portions of the respective first and second lead-out electrodes, the end portions being opposed to the sides where the respective first and second excitation electrode are connected. Each of the terminal electrodes is arranged to occupy an area not less than about 10% of the area of an annular region which extends over a normal-line distance of about 1.2 d to about 2 d from the outer peripheral edge of each of the excitation electrodes, where d is the diameter of each of the excitation electrodes.

In another aspect of various preferred embodiments of the present invention, solder is provided on at least a portion of the first and second main surfaces of the piezoelectric substrate, which occupies an area not less than about 10% of the area of the region between the excitation regions of the fundamental wave and the third harmonic in the terminal electrode.

In still another aspect of various preferred embodiments of the present invention, solder is provided over the entire upper surfaces of the terminal electrodes.

The piezoelectric resonator in accordance with another preferred embodiment of the present invention may further include first and second lead terminals bonded to the respective first and second terminal electrodes by soldering.

The piezoelectric resonator in accordance with other preferred embodiments of the present invention may be constructed as a chip type piezoelectric resonance component.

The above and other novel features, characteristics, advantages and elements of the present invention will become more apparent from the following detailed description of preferred embodiments thereof with reference to the accompanying drawings. It is to be expressly understood, however, that the drawings are for the purpose of illustration only and are not intended as a definition of the limits of the present invention.

BRIEF DESCRIPTION OF THE DRAWINGS

FIG. 2 is a diagram showing the relationship between the size difference B between the radius of an excitation electrode and the radius of an imaginary circle A corresponding to the outer peripheral edge of the excitation region of the third harmonic, and the response (phase value) of the fundamental wave and the third harmonic in the piezoelectric resonator in accordance with the first preferred embodiment.

FIG. 3 is a diagram showing the relationship between the ratio of an electrode extension portion in an annular region within the range between about 1.2 d and about 2 d in the normal-line distance from the outer peripheral edge of the excitation electrode, and the responses of the fundamental wave and the third harmonic.

FIG. 10 is a plan view showing an example of a conventional energy-trap type piezoelectric resonator.

DETAILED DESCRIPTION OF PREFERRED EMBODIMENTS

Figure 1A:
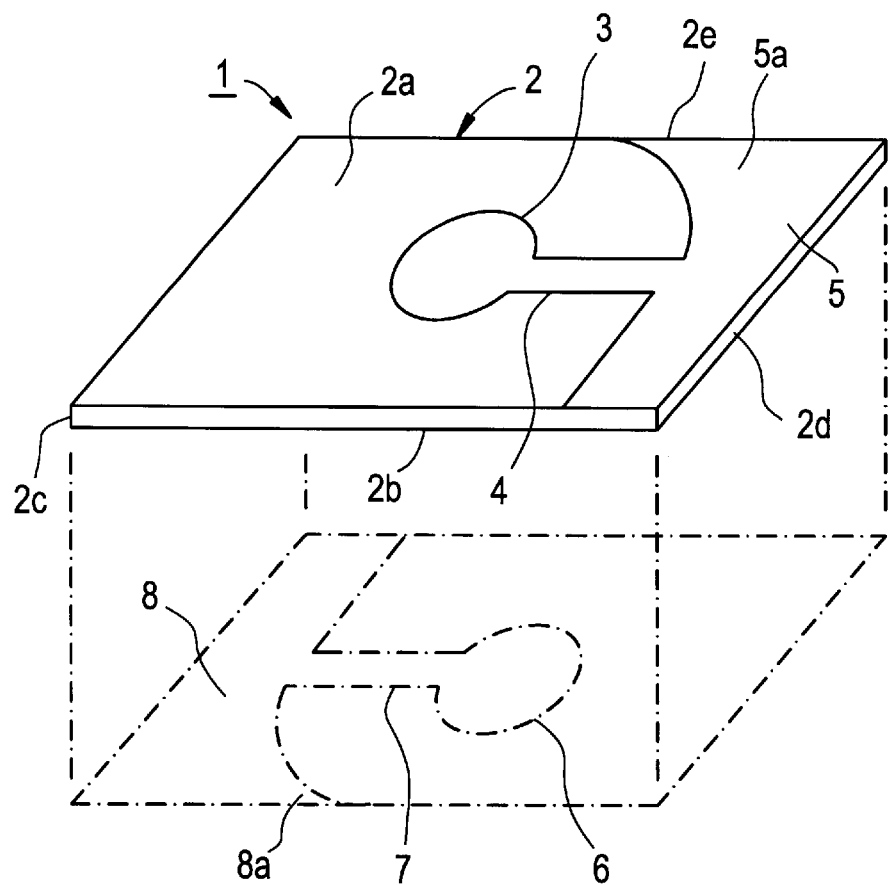
FIG. 1A is a perspective view of a piezoelectric resonator in accordance with a first preferred embodiment of the present invention.
Figure 1B:
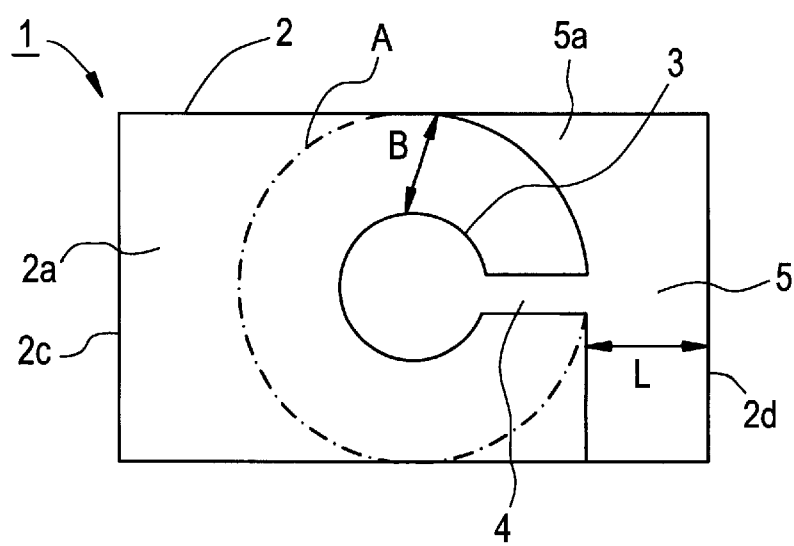
FIG. 1B is a plan view of a piezoelectric resonator in accordance with the first preferred embodiment of the present invention.

In FIGS. 1A and 1B, a piezoelectric resonator 1 in accordance with the first preferred embodiment of the present invention is shown. The piezoelectric resonator 1 preferably has a substantially rectangular piezoelectric substrate 2. The piezoelectric substrate 2 is also preferably made of a piezoelectric ceramic such as lead titanate zirconate-based ceramic, or a piezoelectric single crystal such as quartz. In the case where the piezoelectric substrate 2 is made of a piezoelectric ceramic, the piezoelectric substrate 2 is polarized in the thickness direction.

At the approximately central portion of an upper surface 2a of the piezoelectric substrate 2, a first excitation electrode 3 having a substantially circular shape is provided. A lead-out electrode 4 is connected with the first excitation electrode 3, and a terminal electrode 5 is connected to the outer end of the lead-out electrode 4.

On the lower surface of the piezoelectric substrate 2, a second excitation electrode 6 is arranged to be opposed to the first excitation electrode 3 with the piezoelectric substrate 2 disposed therebetween. A second lead-out electrode 7 is connected with the second excitation electrode 6, and a second terminal electrode 8 is connected to the outer end of the second lead-out electrode 7.

The terminal electrode 5 is arranged on the upper surface 2a of the piezoelectric substrate 2 along the length of the edge defined by an end surface 2d and the upper surface 2a of the piezoelectric substrate 2. Also, the terminal electrode 5 has an electrode extension portion 5a which extends toward an end surface 2c side, at an end surface 2e side. The electrode extension portion 5a is constructed so as to be situated outside an imaginary circle A shown in FIG. 1B.

The imaginary circle A is preferably disposed at a normal-line distance of about 1.2 d from the outer peripheral edge of the excitation electrode 3, where d denotes the diameter of the excitation electrode 3.

The present preferred embodiment includes the novel feature that an electrode extension portion 5a and an electrode extension portion 8a are arranged so that each of the above-described terminal electrodes 5 and 8 occupy an area that is not less than about 10% of the area of an annular region which extends over a normal-line distance of about 1.2 d to about 2 d from the outer peripheral edge of each of the excitation electrodes 3 and 6.

Next, in accordance with specific examples of preferred embodiments of the present invention, the minimizing of spurious responses based on the response of the fundamental wave achieved by the novel arrangement of the above-described electrode extension portions 5a and 8a, will be described.

As the piezoelectric substrate 2, a substantially rectangular piezoelectric substrate which was made of a PZT-based ceramic and which had an approximate size of 2.35 mm×3.70 mm×0.48 mm (thickness) was prepared. At the approximately central portions of both main surfaces of this piezoelectric substrate 2, the excitation electrodes 3 and 6 having a diameter d of about 1.4 mm were provided. For the terminal electrode 5, the distance L in FIG. 1B, that is, the distance L from the outside end of the lead-out electrode 4 to the end surface 2d was about 0.4 mm. By varying the difference in radius B between the imaginary circle A and the excitation electrode 3, various piezoelectric resonators were made, and the phase-frequency characteristics thereof were measured. FIG. 2 shows the responses of the fundamental wave and the third harmonic expressed by the phase-frequency characteristics.

In FIG. 2, the horizontal axis shows the difference B in radius between the imaginary circle A and the excitation electrode 3, and the vertical axis shows the magnitude of the responses of the fundamental wave and the third harmonic (relative value of phase). Here, the phase values of the fundamental wave and the third harmonic in the conventional piezoelectric resonator which is indicated by "No Electrode Extension Portion" in FIG. 2, that is, the piezoelectric resonator without the electrode extension portions 5a and 8a, were each set to 1. The relative values shown in FIG. 2 indicates the relative ratios of fundamental waves and third harmonics in other piezoelectric resonators with respect to the above-described predetermined phase value.

It can be seen from FIG. 2 that, in the range of size B from about 0.3 mm to about 0.5 mm, the response of the third harmonic is substantially equal to that of the conventional piezoelectric resonator without electrode extension portions 5a and 8a, but that the fundamental wave is greatly and effectively damped. When the size B is about 0.2 mm, not only is the fundamental wave greatly and very effectively damped, but the response of the third harmonic is also significantly damped.

Thus, if each of the electrode extension portions 5a and 8a is disposed in the region where the size B is about 0.3 to about 0.5 mm, in other words, an annular region which extends over a normal-line distance of about 1.2 d to about 2 d from the outer peripheral edge of each of the excitation electrodes 3 and 6, where the diameters of the excitation electrodes 3 and 6 are each d, the third harmonic is greatly and effectively utilized while sufficiently damping the fundamental wave.

In the same manner as the above-described examples, it was also discovered how much area each of the electrode extension portions 5a and 8a should occupy out of the area of an annular region which ranges over a normal-line distance of about 1.2 d to about 2 d from the outer peripheral edge of each of the excitation electrodes 3 and 6, in order to have highly effective electrode extension portions 5a and 8a. Specifically, for the piezoelectric resonator prepared in the above-described examples, the phase-frequency characteristics were measured by varying the ratios of the areas occupied by the electrode extension portions 5a and 8a in the region where the size B is about 0.3 to about 0. 5 mm. In FIG. 3, the responses of the fundamental wave and the third harmonic, which represent the phase-frequency characteristics, are shown.

In FIG. 3, the horizontal axis shows the ratio (%) of the electrode extension portions 5a and 8a in the region where B is about 0.3 to about 0.5 mm, in an annular region from about 1.2 d to about 2 d, and the vertical axis shows the magnitude of the responses of the fundamental wave and the third harmonic (relative value of phase) as in the case of FIG. 2. Here, the phase values of the fundamental wave and the third harmonic in the case where the ratio of the electrode extension portions 5a and 8a is 0% in FIG. 3, are set to 1. The relative values shown in FIG. 3 indicate the relative ratios of fundamental waves and third harmonics in several piezoelectric resonators with respect to the above-described predetermined phase value.

It can be seen from FIG. 3 that, if each of the electrode extension portions 5a and 8a is arranged to occupy an area less than about 10% of the area of an annular region which ranges over a normal-line distance of about 1.2 d to about 2 d from the outer peripheral edge of each of the excitation electrodes 3 and 6, the damping of the fundamental wave is not sufficient.

It can be recognized that, where the diameters of the excitation electrodes 3 and 6 are each d, if each of the electrode extension portions 5a and 8a is arranged so as to occupy an area not less than about 10% of the area of an annular region which ranges over a normal-line distance of about 1.2 d to about 2 d from the outer peripheral edge of each of the excitation electrodes 3 and 6, the third harmonic can be effectively utilized while damping the fundamental wave.

Figure 4:
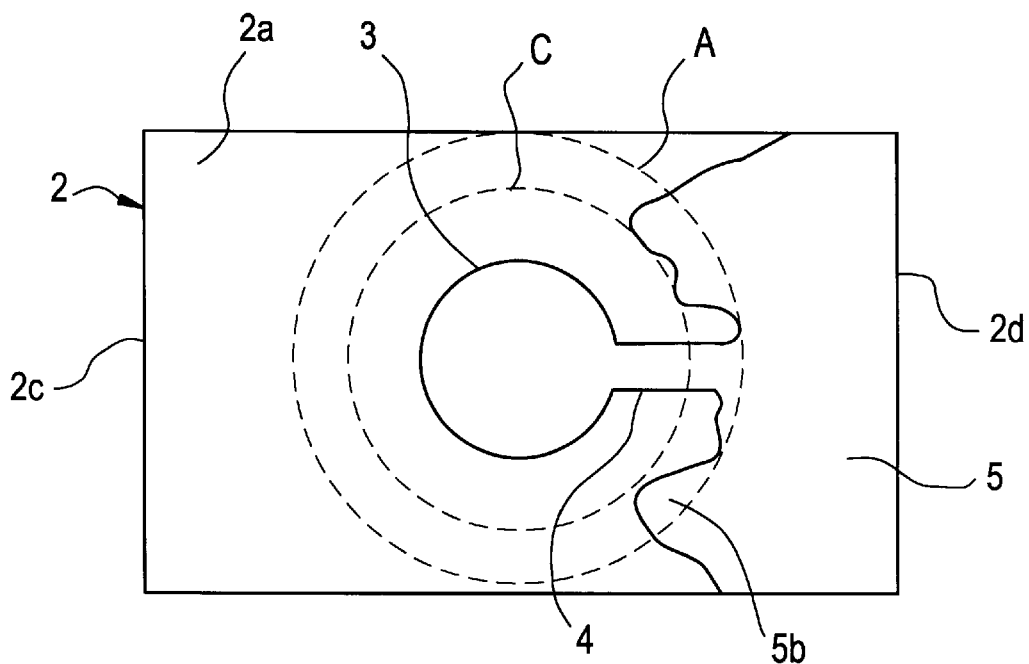
FIG. 4 is a plan view showing a modified example of the piezoelectric resonator of the first preferred embodiment of the present invention.

In the first preferred embodiment, although the electrode extension portions 5a and 8a are each arranged to be connected with the outer peripheral edges of the imaginary circle A and so as to be located outside the imaginary circle A, the configuration of the electrode extension portion is not particularly limited. For example, as illustrated in FIG. 4, an electrode extension portion 5b with random projections and depressions may be arranged so as to occupy an area more than about 10% of the area of the region between an imaginary circle C of which the above-described normal-line distance is about 1.2 d and the imaginary circle A of which the above-described normal-line distance is about 2d.

Figure 5:
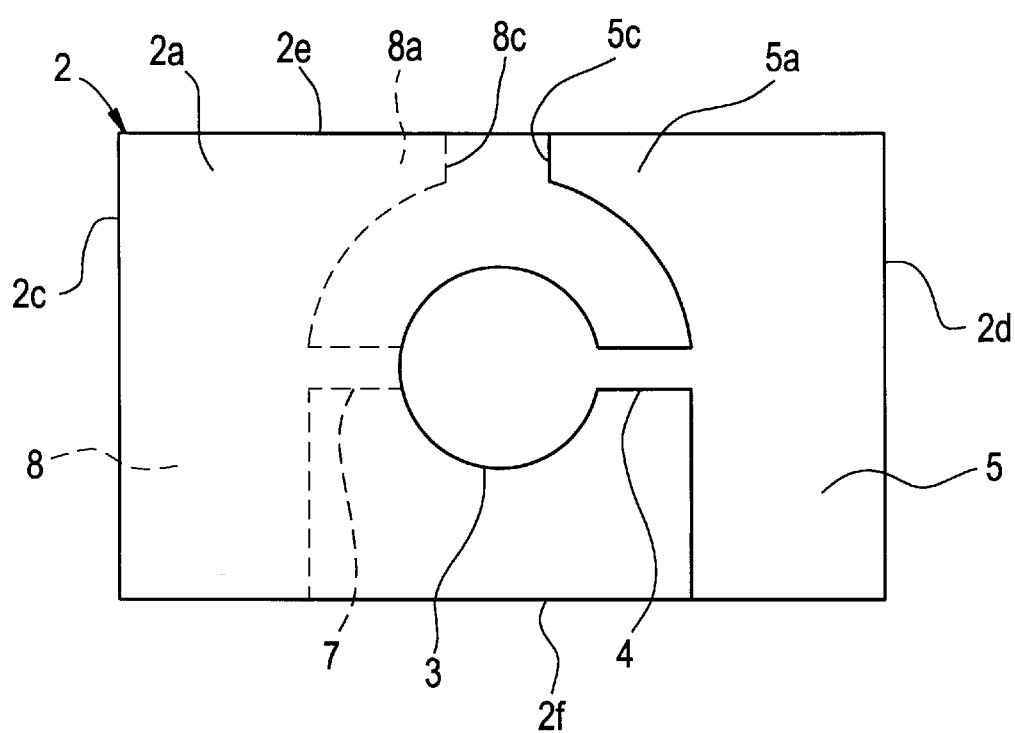
FIG. 5 is a plan view showing a modified example of a piezoelectric resonator according to a second preferred embodiment of the present invention.

Also, as shown in FIG. 5, the electrode extension portion 5a may be modified so that a linear portion 5c leading to the side surface 2e of the piezoelectric substrate 2 is provided. In this case, a linear portion 8c may also be provided for the terminal electrode 8 on the lower surface 2b of the piezoelectric substrate 2, similarly to the linear portion 5c, that is, the linear portions 5c and 8c may be opposed at the side surface 2e side.

Figure 6:
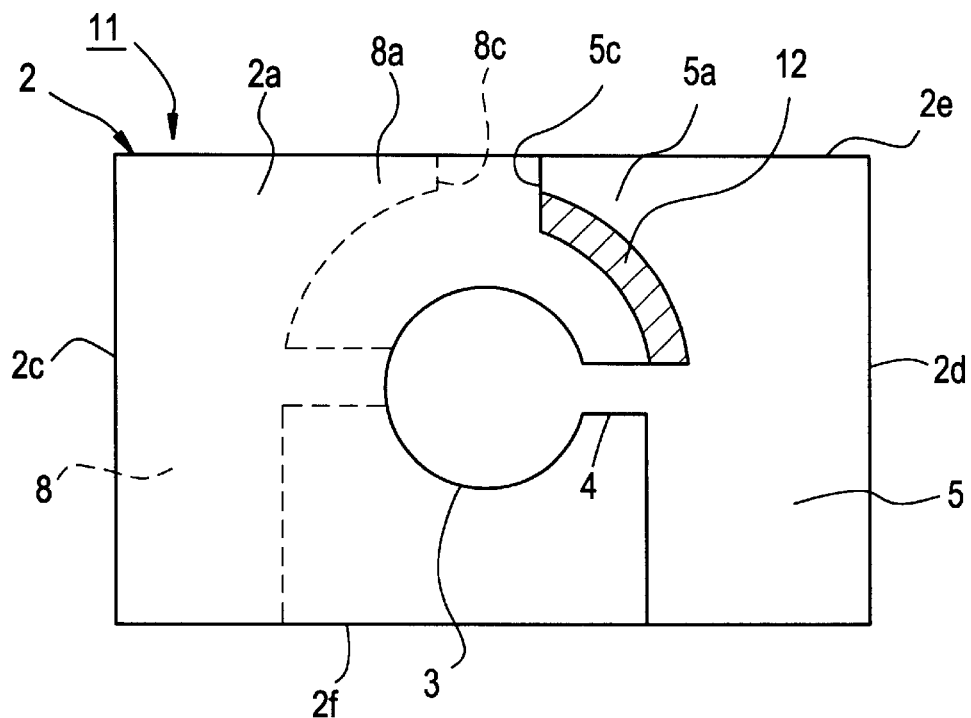
FIG. 6 is a diagram showing the piezoelectric resonator in accordance with the second preferred embodiment of the present invention.

In FIG. 6, a piezoelectric resonator 11 in accordance with a second preferred embodiment of the present invention is shown.

In the piezoelectric resonator 11 of the second preferred embodiment, a terminal electrode 5 is preferably constructed in the same manner as the modified example of the piezoelectric resonator 1 shown in FIG. 5, but differs therefrom in that a solder layer 12 is disposed on the terminal electrode 5.

The solder layer 12 is provided on the terminal electrode 5 at the portion which occupies an area not less than about 10% of the area of the region extending over a normal-line distance of about 1.2 d to about 2 d, that is, a portion of the electrode extension portion 5a. In this case, the provision of the solder layer 12 achieves very effective damping of the fundamental wave.

In other respects, the second preferred embodiment is preferably similar to the first preferred embodiment, and therefore an explanation thereof will be omitted and the corresponding portions of the explanation of the first preferred embodiment will be utilized to avoid repetition. The same portions are therefore identified by the same reference numerals in the first and second preferred embodiments.

Meanwhile, the above-described solder layer 12 may be arranged over the entire region of the electrode extension portion 5a, and further may be arranged so as to cover the entire region of the terminal electrode 5.

Also, the terminal electrode 8 on the lower surface may be provided with a solder layer in the same manner.

Figure 7:
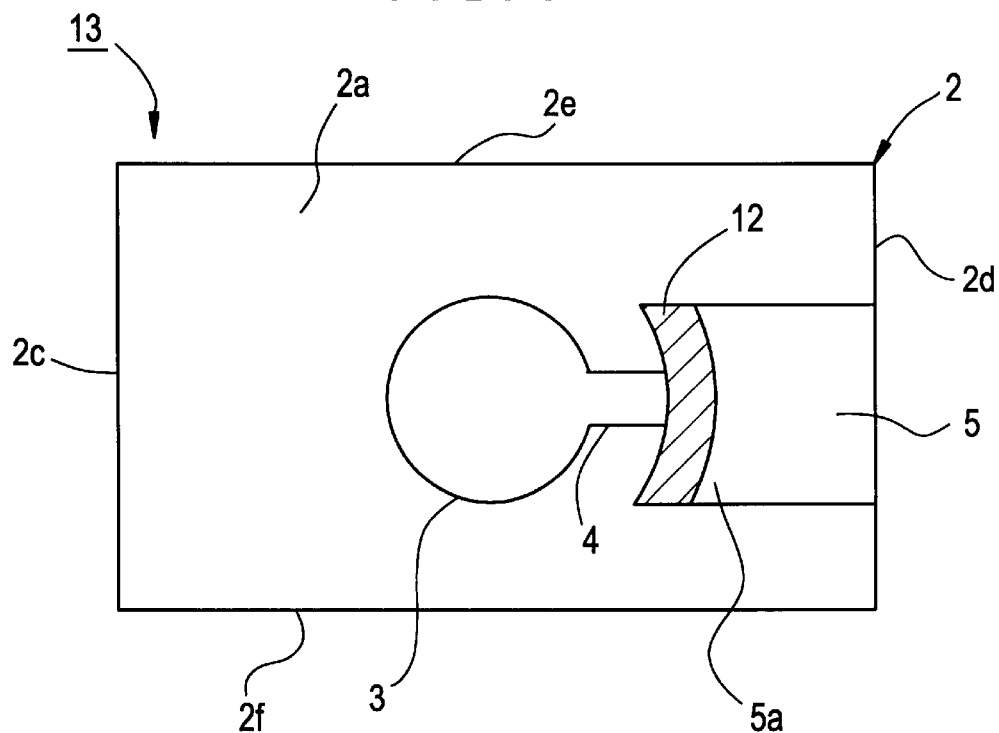
FIG. 7 is a plan view showing another modified example of the piezoelectric resonator of the second preferred embodiment of the present invention.
Figure 8:
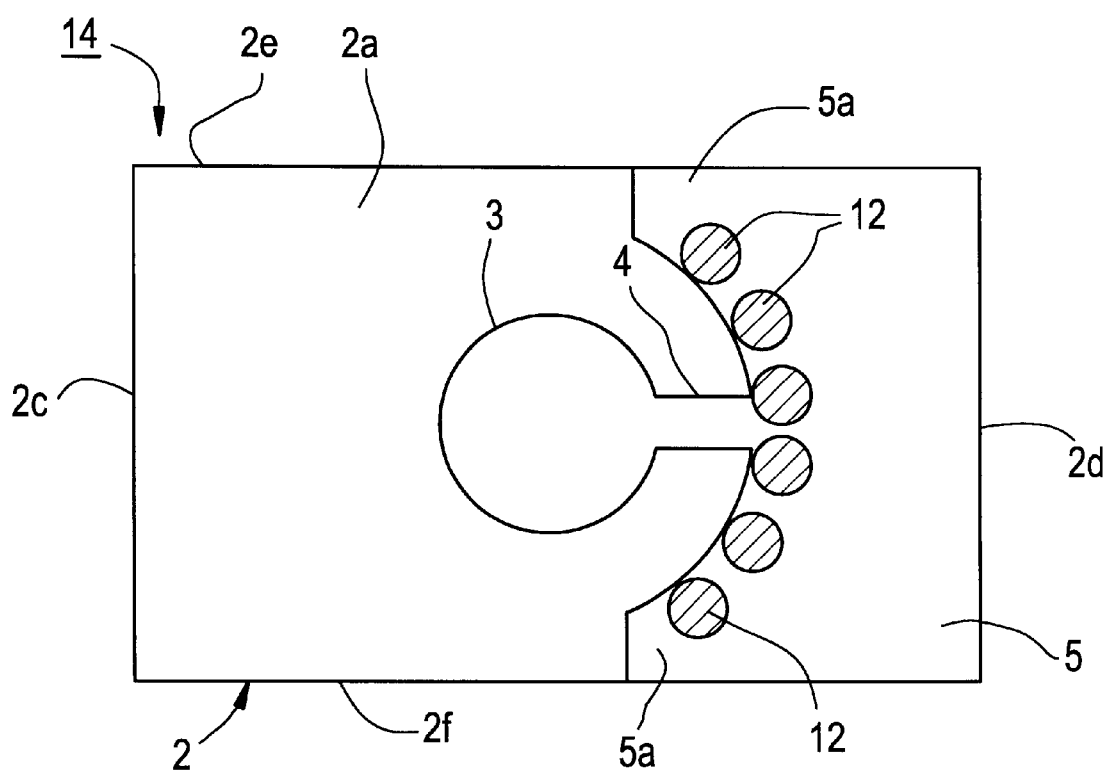
FIG. 8 is a plan view showing still another modified example of the piezoelectric resonator of the second preferred embodiment of the present invention.
Figure 9:
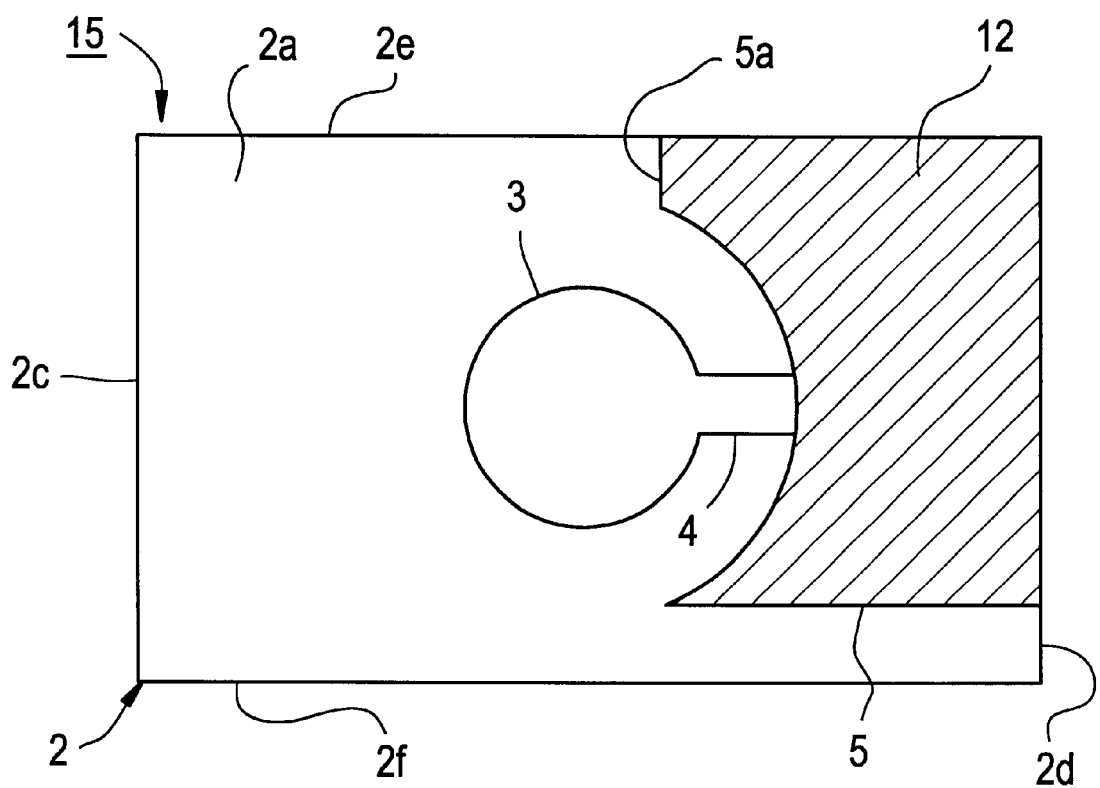
FIG. 9 is a plan view showing a further modified example of the piezoelectric resonator of the second preferred embodiment of the present invention.

In FIGS. 7 through 9, modified examples in accordance with the second preferred embodiment of the present invention are shown.

In a piezoelectric resonator 13 shown in FIG. 7, a terminal electrode 5 is arranged so as not to cover the entire width of the end surface 2d of the piezoelectric substrate 2. Also, an electrode extension portion 5a is disposed inside the terminal electrode 5, and a solder layer 12 is arranged to extend over the electrode extension portion 5a.

In a piezoelectric resonator 14 shown in FIG. 8, an electrode extension portion 5a of the terminal electrode 5 is located on both sides of a lead-out electrode 4, and also a plurality of solder layers 12 are distributed on the electrode extension portion 5a of the terminal electrode 5. When providing a sold layer, the solder layer may be distributed in this manner as a plurality of solder layers 12.

In a piezoelectric resonator 15 shown in FIG. 9, a terminal electrode 5 is arranged so as not to extend to one side surface 2f of the piezoelectric substrate 2, and a solder layer 12 is disposed over the entire upper surface of the terminal electrode 5.

As can be seen from FIGS. 7 through 9, in the piezoelectric resonator in accordance with various preferred embodiments of the present invention, the configurations of the terminal electrodes 5 and 8 can be appropriately changed so long as the terminal electrodes are arranged so as to occupy an area not less than about 10% of the area of the region between the excitation regions of the fundamental wave and the third harmonic, and also the shape of a formation portion of a solder layer can be appropriately changed when forming a solder layer as in the case of the second preferred embodiment.

In addition, the piezoelectric resonator in accordance with various preferred embodiments of the present invention may be constructed as a piezoelectric resonance component with leads by connecting first and second lead terminals to the terminal electrodes 5 and 8 via soldering, or may be constructed as a chip type piezoelectric resonance component by accommodating the piezoelectric resonator 1 in an appropriate package structure.

As described hereinabove, in the piezoelectric resonator in accordance with various preferred embodiments of the present invention, since each of the first and second terminal electrodes is arranged to occupy an area not less than about 10% of the area of an annular region which ranges over a normal-line distance of about 1.2 d to about 2 d from the outer peripheral edge of each of the excitation electrodes, the fundamental wave is greatly and sufficiently damped, and also the resonance characteristics based on the third harmonic are effectively utilized, which permits an energy-trap type piezoelectric resonator utilizing the third harmonic of a thickness vertical mode and having superior resonance characteristics to be provided.

Furthermore, the conventional piezoelectric resonator requires the use of a damping material constituted of resin or the like for damping the fundamental wave, whereas the piezoelectric resonator in accordance with various preferred embodiments of the present invention effectively and greatly damps the fundamental wave only by extending the terminal electrode so as to occupy an area not less than about 10% of the area of the above-described region. Consequently, preferred embodiments of the present invention can be manufactured with ease and formed with high accuracy. The piezoelectric resonator in accordance with various preferred embodiments of the present invention, therefore, can more effectively damp the fundamental wave, and also allows a reduction in device size.

If solder is provided on at least a portion of the electrode extension portion which is arranged so as to occupy an area not less than about 10% of the area of the region between the excitation regions of the fundamental wave and the third harmonic, the effect of the mass added of the solder achieves highly effective damping of the fundamental wave.

If solder is provided over the entire upper surface of the terminal electrode, the fundamental wave is damped even more effectively, and also the electrical connection and the physical bonding of lead terminals or a package with connecting electrodes, etc. is easily performed by utilizing the solder.

If the first and second lead terminals are bonded to the first and second terminal electrodes by solder, not only is the fundamental wave sufficiently damped in accordance with preferred embodiments of the present invention, but also a piezoelectric resonance component with leads capable of effectively utilizing the resonance characteristics of the third harmonic can be provided.

While the invention has been described with reference to preferred embodiments thereof, many modifications and variations of the present invention are possible in light of the above teachings. It is therefore to be understood that within the scope of the appended claims, the invention may be practiced otherwise than as specifically described.

What is claimed is:

1. A piezoelectric resonator comprising:
    a piezoelectric substrate having first and second main surfaces;
    first and second excitation electrodes disposed on portions of the first and second main surfaces, respectively, of said piezoelectric substrate, said first and second excitation electrodes being opposed to each other via said piezoelectric substrate on the first and second main surfaces;
    first and second lead-out electrodes electrically connected to said first and second excitation electrodes, respectively, said first and second lead-out electrodes being arranged on the first and second main surfaces of said piezoelectric substrate, respectively; and
    first and second terminal electrodes arranged to establish external connections, said first and second terminal electrodes being disposed at the end portions of said first and second lead-out electrodes, respectively, said end portions being opposed to the sides where said respective first and second excitation electrodes are connected;
    wherein each of said first and second terminal electrodes is arranged so as to occupy an area not less than about 10% of the area of an annular region which ranges over a normal-line distance of about 1.2 d to about 2 d from the outer peripheral edge of each of said first and second excitation electrodes, where d is the diameter of each of said first and second excitation electrodes.

2. A piezoelectric resonator as claimed in claim 1, wherein an annular region which ranges over a normal-line distance of about 1.2 d to about 2 d from the outer peripheral edge of each of the first and second excitation electrodes, is the region between the excitation regions of a fundamental wave and a third harmonic of each of said first and second terminal electrodes.

3. A piezoelectric resonator as claimed in claim 2, wherein a solder layer is provided on at least a part of the portion where each of said first and second terminal electrodes occupy an area that is not less than about 10% of the area of said annular region.

4. A piezoelectric resonator as claimed in claim 2, wherein the solder layer is arranged to extend over the entire upper surfaces of said first and second terminal electrodes.

5. A piezoelectric resonator as claimed in claim 1, further comprising first and second lead terminals bonded to said respective first and second terminal electrodes via soldering.

6. A piezoelectric resonator as claimed in claim 1, wherein the piezoelectric substrate is substantially rectangular.

7. A piezoelectric resonator as claimed in claim 1, wherein the piezoelectric substrate is made of one of a piezoelectric ceramic and a piezoelectric single crystal.

8. A piezoelectric resonator as claimed in claim 1, wherein the first and second excitation electrodes have a substantially circular shape.

9. A piezoelectric resonator as claimed in claim 1, wherein each of the first and second excitation electrodes include electrode extension portions, each of the electrode extension portions is disposed in the region having an area of about 0.3 mm to about 0.5 mm.

10. A piezoelectric resonator as claimed in claim 1, wherein no damping material is provided on the piezoelectric substrate.

11. A piezoelectric resonator vibrating in a thickness vertical vibration mode, comprising:
    a piezoelectric substrate having first and second main surfaces;
    first and second excitation electrodes disposed on portions of the first and second main surfaces, respectively, of said piezoelectric substrate, said first and second excitation electrodes being opposed to each other via said piezoelectric substrate on the first and second main surfaces;
    first and second lead-out electrodes electrically connected to said first and second excitation electrodes, respectively, said first and second lead-out electrodes being arranged on the first and second main surfaces of said piezoelectric substrate, respectively, and each of said first and second lead-out electrodes having an end portion; and first and second terminal electrodes arranged to establish external connections, said first and second terminal electrodes being disposed at the end portions of said first and second lead-out electrodes, respectively, said end portions being opposed to the sides where said respective first and second excitation electrodes are connected, each of said first and second terminal electrodes having an upper surface;

wherein no damping material is provided on the piezoelectric substrate and each of said first and second terminal electrodes is arranged so as to effectively damp a fundamental wave of the thickness vertical vibration mode.

12. A piezoelectric resonator as claimed in claim 11, wherein each of said first and second terminal electrodes is arranged so as to occupy an area not less than about 10% of the area of an annular region which ranges over a normal-line distance of about 1.2 d to about 2 d from the outer peripheral edge of each of said first and second excitation electrodes, where d is the diameter of each of said first and second excitation electrodes.

13. A piezoelectric resonator as claimed in claim 12, wherein the annular region which ranges over a normal-line distance of about 1.2 d to about 2 d from the outer peripheral edge of each of the first and second excitation electrodes, is the region between the excitation regions of a fundamental wave and a third harmonic of each of said first and second terminal electrodes.

14. A piezoelectric resonator as claimed in claim 12, wherein a solder layer is provided on at least a part of the portion where each of said first and second terminal electrodes occupy an area that is not less than about 10% of the area of said annular region.

15. A piezoelectric resonator as claimed in claim 14, wherein the solder layer is arranged to extend over the entire upper surfaces of said first and second terminal electrodes.

16. A piezoelectric resonator as claimed in claim 11, further comprising first and second lead terminals bonded to said respective first and second terminal electrodes via soldering.

17. A piezoelectric resonator as claimed in claim 11, wherein the piezoelectric substrate is substantially rectangular.

18. A piezoelectric resonator as claimed in claim 11, wherein the piezoelectric substrate is made of one of a piezoelectric ceramic and a piezoelectric single crystal.

19. A piezoelectric resonator as claimed in claim 11, wherein the first and second excitation electrodes have a substantially circular shape.

20. A piezoelectric resonator as claimed in claim 11, wherein each of the first and second excitation electrodes include electrode extension portions, each of the electrode extension portions is disposed in the region having an area of about 0.3 mm to about 0.5 mm.

* * * * *